US012392030B2

(12) United States Patent
Bjormander

(10) Patent No.: US 12,392,030 B2
(45) Date of Patent: Aug. 19, 2025

(54) COATED CUTTING TOOL

(71) Applicant: AB SANDVIK COROMANT, Sandviken (SE)

(72) Inventor: Carl Bjormander, Stockholm (SE)

(73) Assignee: AB Sandvik Coromant, Sandviken (SE)

( * ) Notice: Subject to any disclaimer, the term of this patent is extended or adjusted under 35 U.S.C. 154(b) by 473 days.

(21) Appl. No.: 17/801,113

(22) PCT Filed: Feb. 26, 2021

(86) PCT No.: PCT/EP2021/054880
§ 371 (c)(1),
(2) Date: Aug. 19, 2022

(87) PCT Pub. No.: WO2021/170824
PCT Pub. Date: Sep. 2, 2021

(65) Prior Publication Data
US 2023/0093032 A1 Mar. 23, 2023

(30) Foreign Application Priority Data
Feb. 28, 2020 (EP) .................................... 20159982

(51) Int. Cl.
*C23C 16/36* (2006.01)
*B23B 27/14* (2006.01)
*C23C 16/56* (2006.01)

(52) U.S. Cl.
CPC ............ *C23C 16/36* (2013.01); *B23B 27/148* (2013.01); *C23C 16/56* (2013.01); *B23B 2228/105* (2013.01)

(58) Field of Classification Search
None
See application file for complete search history.

(56) References Cited

U.S. PATENT DOCUMENTS 8,043,729 B2   10/2011   Sundstrom et al.
2004/0115484 A1*   6/2004   Horling ................. C23C 30/005
428/698

(Continued)

FOREIGN PATENT DOCUMENTS

DE   102006027139 A1   12/2007
EP   1829990 A1   2/2007

(Continued)

*Primary Examiner* — Seth Dumbris
(74) *Attorney, Agent, or Firm* — Corinne R. Gorski

(57) ABSTRACT

A coated cutting tool for metal machining has a base body of cemented carbide, cermet, ceramics, steel or high-speed steel, and a wear resistant coating deposited thereon. The coating includes a layer of $Ti_{1-x}Al_xC_yN_z$ with $0.40 \leq x \leq 0.95$, $0 \leq y \leq 0.10$ and $0.85 \leq z \leq 1.15$, and a portion of $MeC_aN_b$, $0 \leq a \leq 1$, $0 \leq b \leq 1$, $a+b=1$, present on the layer of $Ti_{1-x}Al_xC_yN_z$. The portion of $MeC_aN_b$ covers from 5 to 28% of the layer of $Ti_{1-x}Al_xC_yN_z$. A process for the production of the coated cutting tool and the use of the coated cutting tool in machining of stainless steel is also provided.

15 Claims, 4 Drawing Sheets

(56) References Cited

U.S. PATENT DOCUMENTS

| | | |
|---|---|---|
| 2008/0210064 A1 | 9/2008 | Mikus et al. |
| 2010/0135737 A1 | 6/2010 | Fukano et al. |
| 2011/0002749 A1 | 1/2011 | Ljungberg et al. |
| 2011/0206470 A1* | 8/2011 | Waki .................. C23C 14/0641 |
| | | 407/119 |
| 2015/0217378 A1* | 8/2015 | Tatsuoka ................ C23C 28/42 |
| | | 428/697 |
| 2018/0216224 A1* | 8/2018 | Stiens .................. C23C 16/403 |

FOREIGN PATENT DOCUMENTS

| | | |
|---|---|---|
| JP | H04250906 A | 9/1992 |
| WO | 2014096351 A1 | 6/2014 |
| WO | 2017016826 A1 | 2/2017 |

* cited by examiner

1 μm

TiAlN (8)

TiN (9)

TiAlN (8)

TiN (9)

COATED CUTTING TOOL

RELATED APPLICATION DATA

This application is a § 371 National Stage Application of PCT International Application No. PCT/EP2021/054880 filed Feb. 26, 2021 claiming priority to EP 20159982.6 filed Feb. 28, 2020.

The present invention relates to a coated cutting tool for metal machining having a base body and a wear resistant coating deposited thereon comprising a $Ti_{1-x}Al_xC_yN_z$ layer with $0.40 \leq x \leq 0.95$, $0 \leq y \leq 0.10$ and $0.85 \leq z \leq 1.15$. The present invention further relates to a process for the production of the coated cutting tool and the use of the coated cutting tool in machining of stainless steel.

BACKGROUND

Tools for chip forming metal machining commonly consist of a base body, also called substrate, of cemented carbide provided with a single-layer or multi-layer wear resistant coating for the improvement of the cutting properties and/or the wear properties. One important group of such wear resistant coatings comprises one or more layers of nitrides or carbonitrides of one or more metals. Important examples are nitrides and carbonitrides of Ti and Al, particularly (Ti,Al)N.

Coatings of the afore-mentioned type are commonly deposited by CVD processes (chemical vapor deposition) or by PVD processes (physical vapor deposition).

US 2018/0216224 A addresses this problem and discloses a coated cutting tool with a (Ti,Al)N coating deposited by a CVD process on a cemented carbide substrate. By an annealing procedure there is disclosed a hexagonal phase of w-AlN formed in the grain boundaries of the (Ti,Al)N which imparts compressive stress into the coating.

When machining stainless steel adhesive wear is an important wear mechanism, especially in milling operations. Adhesive wear, or smearing, is characterized in that during the cutting process of sticky materials, such as stainless steel, workpiece material is smeared over, and adhered to, the cutting edge creating a layer of material which may form a so called built-up edge. Flaking of the coating is a common problem in connection to adhesive wear.

Thus, there is a need for an improvement in performance of (Ti,Al)N coated tools when milling smearing workpiece materials such as stainless steel.

OBJECT OF THE INVENTION

The object of the present invention is to provide a coated cutting tool for metal machining, particularly milling, of smearing workpiece materials such as stainless steel, in which the coating exhibits high flaking resistance and long tool life.

The Invention

The object of the invention is solved by a coated cutting tool having a rake face, a flank face and a cutting edge in between comprising a base body of cemented carbide, cermet, ceramics, steel or high-speed steel, and a coating having a total thickness of from 2 to 20 µm, said coating comprises a layer of $Ti_{1-x}Al_xC_yN_z$ with $0.40 \leq x \leq 0.95$, $0 \leq y \leq 0.10$ and $0.85 \leq z \leq 1.15$, having a thickness of from 1 to 18 µm, the layer of $Ti_{1-x}Al_xC_yN_z$ comprises crystallites with grain boundaries and being of a columnar structure, the $Ti_{1-x}Al_xC_yN_z$ comprises 85 vol-% face-centered cubic (fcc) crystal structure, and, on the rake face, a portion of $MeC_aN_b$, $0 \leq a \leq 1$, $0 \leq b \leq 1$, $a+b=1$, present on the layer of $Ti_{1-x}Al_xC_yN_z$, wherein the layer of $Ti_{1-x}Al_xC_yN_z$ together with the portion of $MeC_aN_b$ forms the outermost part of the coating, Me is Ti and/or Zr, wherein the portion of $MeC_aN_b$ in an area on the rake face at a distance of from 200 to 400 µm from the cutting edge covers from 5 to 28% of the layer of $Ti_{1-x}Al_xC_yN_z$, the portion of $MeC_aN_b$ is distributed over said area.

In a preferred embodiment, the layer of $Ti_{1-x}Al_xC_yN_z$ is a CVD layer, i.e., it has been deposited by a chemical vapour deposition (CVD) process.

In one embodiment, the layer of $Ti_{1-x}Al_xC_yN_z$ comprises precipitations of $Ti_{1-o}Al_oC_pN_q$ at grain boundaries of the $Ti_{1-x}Al_xC_yN_z$ crystallites, the precipitations of $Ti_{1-o}Al_oC_pN_q$ have a higher Al content than inside the crystallites, wherein $0.95 \leq o \leq 1.00$, $0 \leq p \leq 0.10$, $0.85 \leq q \leq 1.15$ and $(o-x) \geq 0.05$. Preferably, $0.95 \leq o \leq 1.00$, $p=0$, $q=1$ and $0.05 \leq (o-x) \leq 0.25$.

In one embodiment, the layer of $Ti_{1-x}Al_xC_yN_z$ comprises precipitations of $Ti_{1-o}Al_oC_pN_q$ at grain boundaries of the $Ti_{1-x}Al_xC_yN_z$ crystallites in the 0.3 µm uppermost part of the layer. In one embodiment, the layer of $Ti_{1-x}Al_xC_yN_z$ comprises precipitations of $Ti_{1-o}Al_oC_pN_q$ at grain boundaries of the $Ti_{1-x}Al_xC_yN_z$ crystallites in the 0.8 µm uppermost part of the layer. In one embodiment, the layer of $Ti_{1-x}Al_xC_yN_z$ comprises precipitations of $Ti_{1-o}Al_oC_pN_q$ at grain boundaries of the $Ti_{1-x}Al_xC_yN_z$ crystallites throughout the whole layer.

The layer of $Ti_{1-x}Al_xC_yN_z$ has predominantly face-centered cubic (fcc) crystal structure. However, proportions of softer other phases, such as for example hexagonal AlN, can be present in the layer, which, however, are undesired if they are formed by co-deposition together with the fcc-$Ti_{1-x}Al_xC_yN_z$ structure, because they disadvantageously influence the hardness and the wear resistance.

Therefore, the layer of $Ti_{1-x}Al_xC_yN_z$ in the coating of the present invention (total layer including volume proportions of precipitations of $Ti_{1-o}Al_oC_pN_q$ at grain boundaries, if present) comprises 85 vol. %, suitably 90 vol. %, preferably 95 vol %, particularly preferably 98 vol % of face-centered cubic (fcc) crystal structure.

In one embodiment, the precipitations of $Ti_{1-o}Al_oC_pN_q$ at grain boundaries of the $Ti_{1-x}Al_xC_yN_z$ crystallites having a higher Al content than inside the crystallites comprise AlN with hexagonal wurtzite crystal structure (w-AlN), preferably the precipitations of $Ti_{1-o}Al_oC_pN_q$ at grain boundaries of the $Ti_{1-x}Al_xC_yN_z$ crystallites having a higher Al content than inside the crystallites essentially comprise AlN with hexagonal wurtzite crystal structure (w-AlN). The precipitations can contain low proportions of Ti and C. It is assumed that during the generation of the precipitations from the $Ti_{1-x}Al_xC_yN_z$ crystallites having face-centered cubic crystal structure a phase conversion into the hexagonal phase takes place. Because the hexagonal w-AlN phase has a higher volume than the face-centered cubic phase, the conversion apparently goes along with an expansion of the volume. It is therefore further assumed that this expansion of the volume at the grain boundaries of the $Ti_{1-x}Al_xC_yN_z$ crystallites leads to an increase of the residual compressive stress in the $Ti_{1-x}Al_xC_yN_z$ layer.

The $Ti_{1-x}Al_xC_yN_z$ suitably has stoichiometric coefficients of $0.60 \leq x \leq 0.90$, $y=0$ and $0.85 \leq z \leq 1.15$, preferably $0.70 \leq x \leq 0.90$, $y=0$ and $0.85 \leq z \leq 1.15$. In these embodiments, the layer of $Ti_{1-x}Al_xC_yN_z$ comprises essentially no carbide carbon, except for unavoidable impurities and/or impurities conditional of manufacturing, and is essentially a pure nitride layer. For $Ti_{1-x}Al_xC_yN_z$ layers one has to consider that only limited amounts of carbon dissolve in the lattice of the cubic phase, and excess carbon can be present in amorphous form, which can result in a lower hardness of the layer and in disadvantageous tribological properties that can have a disadvantageous effect on the service life of the tool.

In one embodiment the layer of $Ti_{1-x}Al_xC_yN_z$ has a lamellar structure having lamellae with a thickness of not more than 150 nm, preferably not more than 100 nm, particularly preferably not more than 50 nm, wherein the lamellae are formed from periodically alternating regions of the layer of $Ti_{1-x}Al_xC_yN_z$ having alternatingly different stoichiometric contents of Ti and Al and having the same crystal structure (=crystallographic phase) and/or the same crystallographic orientation.

The portion of $MeC_aN_b$ covers from 5 to 28% of the layer of $Ti_{1-x}Al_xC_yN_z$ in an area on the rake face at a distance of from 200 to 400 μm from the cutting edge. Thus, there should remain a portion of $MeC_aN_b$ on the layer of $Ti_{1-x}Al_xC_yN_z$. The specific percentage of coverage of the layer of $Ti_{1-x}Al_xC_yN_z$ by the portion of $MeC_aN_b$ is provided by an intense blasting operation, which nevertheless has to be controlled. If too much $MeC_aN_b$ is removed then the tool life is significantly decreased. On the other hand if too little $MeC_aN_b$ is removed the tool life is quite bad as well.

Suitably, the portion of $MeC_aN_b$ in an area on the rake face at a distance of from 200 to 400 μm from the cutting edge covers from 6 to 26%, preferably from 7 to 24%, most preferably from 8 to 22%, of the layer of $Ti_{1-x}Al_xC_yN_z$, the portion of $MeC_aN_b$ is distributed over said area.

The covering of the layer of $Ti_{1-x}Al_xC_yN_z$ by the portion of $MeC_aN_b$ is suitably determined by image analysis of an at least about 25 μm×15 μm area of a top view Scanning Electron Microscope (SEM) image with a magnification of 5000×.

The portion of $MeC_aN_b$ is suitably distributed over the area on the rake face at a distance of from 200 to 400 μm from the cutting edge on the rake face in a way that if a grid of 2.5 μm×2.5 μm squares is put over a top view Scanning Electron Microscope (SEM) image with a magnification of 5000×, then >75%, preferably >90%, of the 2.5 μm×2.5 μm squares show both $MeC_aN_b$ and $Ti_{1-x}Al_xC_yN_z$, the number of squares being at least 60.

In the $MeC_aN_b$, Me is Ti and/or Zr. If $MeC_aN_b$ contains both Ti and Zr they may be present in any atomic ratio. Suitably, Me is Ti or Zr. In the $MeC_aN_b$, suitably 0≤a≤0.5, 0.5≤b≤1, preferably 0≤a≤0.1, 0.9≤b≤1. In a preferred embodiment $MeC_aN_b$ is TiN.

The coated cutting tool has been subjected to intense blasting during its manufacture which has provided a smoothened surface. In one embodiment the surface roughness, Ra, of the coating on the rake face is from 20 to 60 nm, preferably from 30 to 50 nm. The surface roughness is measured within an area at a distance of from 200 to 400 μm from the cutting edge.

The upper surface of a layer of $Ti_{1-x}Al_xC_yN_z$ after deposition is suitably uneven due to the preferably faceted shape of the upper parts of the $Ti_{1-x}Al_xC_yN_z$ crystallites. The portion of $MeC_aN_b$ is one remaining after a blasting procedure in the manufacturing process where a $MeC_aN_b$ layer deposited onto the layer of $Ti_{1-x}Al_xC_yN_z$ is to a great extend removed. A faceted shape of the upper parts of the $Ti_{1-x}Al_xC_yN_z$ crystallites will lead to a preferred location of the portion of $MeC_aN_b$ over grain boundaries of $Ti_{1-x}Al_xC_yN_z$ crystallites. Thus, in one embodiment of the present invention, $MeC_aN_b$ is situated over at least a part of the grain boundaries of the $Ti_{1-x}Al_xC_yN_z$ crystallites of the layer of $Ti_{1-x}Al_xC_yN_z$.

The grain size of the $Ti_{1-x}Al_xC_yN_z$ crystallites $Ti_{1-x}Al_xC_yN_z$ is herein defined as the average width of the columnar $Ti_{1-x}Al_xC_yN_z$ crystallite in the middle of the layer. In one embodiment the grain size of the $Ti_{1-x}Al_xC_yN_z$ is from 0.2 to 0.8 μm, preferably from 0.3 to 0.6 μm.

The $Ti_{1-o}Al_oC_pN_q$ precipitations at grain boundaries of the $Ti_{1-x}Al_xC_yN_z$ crystallites occupy a volume between the $Ti_{1-x}Al_xC_yN_z$ crystallites. The average distance between $Ti_{1-x}Al_xC_yN_z$ crystallites having $Ti_{1-o}Al_oC_pN_q$ precipitations at their grain boundaries is suitably from 4 to 200 nm, preferably from 10 to 100 nm, most preferably from 25 to 75 nm. The $Ti_{1-o}Al_oC_pN_q$ precipitations can be regarded as a grain boundary phase and said average distance between $Ti_{1-x}Al_xC_yN_z$ crystallites having $Ti_{1-o}Al_oC_pN_q$ precipitations at their grain boundaries can also be regarded as a thickness of the grain boundary phase. If the average distance between $Ti_{1-x}Al_xC_yN_z$ crystallites having $Ti_{1-o}Al_oC_pN_q$ precipitations at their grain boundaries is too low, the increase of the residual compressive stresses in the $Ti_{1-x}Al_xC_yN_z$ layer may be too low to achieve the herein described advantages of improved wear resistance and crack resistance.

If the average distance between $Ti_{1-x}Al_xC_yN_z$ crystallites having $Ti_{1-o}Al_oC_pN_q$ precipitations at their grain boundaries is too high, then the total amount of precipitations is high. Because the precipitations suitably contain a high proportion of hexagonal w-AlN, which is softer than the face-centered cubic $Ti_{1-x}Al_xC_yN_z$, a too high proportion of precipitations leads to an undesired decrease of the hardness of the layer and to impaired cutting properties.

The precipitations can, for example, be shown in the scanning transmission electron microscope (STEM) on sufficiently thin electron-transparent polished cross-sections of the coatings, preferably through samples prepared by focused ion beam (FIB), and the average distance between $Ti_{1-x}Al_xC_yN_z$ crystallites can be determined using the STEM images. Preferably, HAADF detectors (High Angle Annular Dark Field detectors) are used, and the precipitations are made visible in the inverse contrast of the BF-image (bright field) and the HAADF-image. Thereby, the $Ti_{1-o}Al_oC_pN_q$ precipitations having a higher Al content than inside the crystallites appear brighter than the $Ti_{1-x}Al_xC_yN_z$ crystallites in the BF-image, and in the HAADF-image the $Ti_{1-o}Al_oC_pN_q$ precipitations appear darker than the $Ti_{1-x}Al_xC_yN_z$ crystallites.

At a suitable sample thickness and orientation of the $Ti_{1-x}Al_xC_yN_z$ crystallite relative to the electron beam, by high-resolution transmission electron microscopy (HRTEM) one can obtain images from which diffraction images from the $Ti_{1-x}Al_xC_yN_z$ crystallite, as well as from regions of the $Ti_{1-o}Al_oC_pN_q$ excretion at the grain boundary can be derived by Fourier-transformation.

By indexing of the diffraction images one can show that the face-centered cubic (fcc) phase is present in the $Ti_{1-x}Al_xC_yN_z$ crystallite. Also, when the $Ti_{1-o}Al_oC_pN_q$ precipitations comprise w-AlN structure, one can show by indexing of the diffraction images that the crystalline domains of the $Ti_{1-o}Al_oC_pN_q$ grain boundary precipitations indeed have the w-AlN structure, and that there exist epitaxial relationships between the fcc $Ti_{1-x}Al_xC_yN_z$ crystallites and the w-AlN precipitation.

In an alternative, precipitations can be made visible in the scanning electron microscope (SEM) in embedded metallographic polished cross-sections or in samples polished parallel to the surface. Thereby, one takes advantage of the effect that in the final polishing step of the subsequently described preparation process w-AlN is stronger etched than the regions of cubic phases. Since the inventive precipitations contain a high proportion of hexagonal w-AlN, they are clearly visible in the prepared polished cross-sections.

As an example, for the sample preparation of a polished cross-section for the described analyses the produced tool is separated, embedded in, e.g., bakelite, and then treated in the following manner: 6 min of grinding using a grinding wheel Struers Piano220 and water; 3 min of polishing using Struers 9 µm MD-Largo diamond suspension; 3:40 min of polishing using Struers 3 µm MD-Dac diamond suspension; 2 min of polishing using Struers 1 µm MD-Nap diamond suspension; at least 12 min of chemical polishing using Struers OP-S (suspension of colloidal silicone dioxide having an average particle size of 0.04 µm). Prior to the subsequent SEM examination the samples are then cleaned in an ultrasonic bath and demagnetized. On the so produced polished cross-sections the $Ti_{1-x}Al_xC_yN_z$ layers are imaged in the FE-SEM using a secondary electron detector at an accelerating voltage of 2.5 kV and typical working distances of 3-10 mm. Thereby, in the polished cross-section of the samples there is observed the columnar structure of the $Ti_{1-x}Al_xC_yN_z$ layer, which in the non-annealed condition has about 100% face-centered cubic (fcc) structure. The precipitations at the grain boundaries, that are etched stronger than the crystallites in the final step of chemical polishing in the above-described preparation, can be identified as darker regions due to the topography and the atomic number contrast. The crystallites contain essentially 100% face-centered cubic phase, whereas the w-AlN phase proportions formed through the annealing are contained in the $Ti_{1-o}Al_oC_pN_q$ grain boundary precipitations, whereby it is supposed that the $Ti_{1-o}Al_oC_pN_q$ grain boundary precipitations predominantly consist of w-AlN. The determination of the broadness of the $Ti_{1-o}Al_oC_pN_q$ grain boundary precipitations and the determination of the minimum content of fcc phase in the $Ti_{1-x}Al_xC_yN_z$ layer is generally possible on the so generated images by measuring the images or by the application of established image analysis procedures.

In one embodiment the $Ti_{1-x}Al_xC_yN_z$ layer has residual compressive stresses, suitably within the range of from <0 MPa to −5000 MPa, preferably within the range of from −300 MPa to −3500 MPa, measured on the (222) reflection at ~ 81.5-82 degrees 2-theta of the fcc-$Ti_{1-x}Al_xC_yN_z$ phase by the $\sin^2 \psi$ method.

By residual compressive stresses in the $Ti_{1-x}Al_xC_yN_z$ layer the resistance against crack formation, especially comb crack formation, and thus the wear resistance of the tool is improved. Too high residual compressive stresses in the $Ti_{1-x}Al_xC_yN_z$ layer can, however, lead to adhesion problems and chipping of the layer.

In one embodiment there is a further layer provided directly onto the base body having a thickness of from 0.05 µm to 2 µm, preferably of from 0.1 µm to 1 µm, the further layer is a metal nitride or a metal carbonitride layer, Me is an element belonging to group 4 of the periodic table of elements, preferably a TiN layer or a Ti(C,N) layer. This further layer has suitably a function of improving adhesion between the base body and a layer above.

The layer of $Ti_{1-x}Al_xC_yN_z$ has suitably a thickness of from 1 to 15 µm, preferably from 3 to 12 µm, most preferably from 5 to 10 µm.

The total thickness of the coating is suitably from 2 to 16 µm, preferably from 5 to 12 µm.

The base body is preferably a base body of cemented carbide.

The cemented carbide suitably comprises from 5 to 15 wt % Co, optionally up to 10 wt % carbides or carbonitrides of one or more metals from groups 4, 5 and 6 in the periodic table of elements, and from 75 to 95 wt % WC. In one embodiment the cemented carbide has a composition of from 5 to 15 wt % Co, optionally up to 10 wt % carbides or carbonitrides of one or more metals from groups 4, 5 and 6 in the periodic table of elements, and balance WC. The metals from groups 4, 5 and 6 in the periodic table of elements in the optionally carbides or carbonitrides are suitably belonging to the group of Ti, Ta, Nb, V, Zr, Cr, and Mo, W may also additionally be present in the carbides or carbonitrides.

The coated cutting tool is suitably a milling insert or a turning insert, a drill or an endmill. Preferably, the coated cutting tool is a milling insert.

The invention also relates to a process for the production of the herein described coated cutting tool having a rake face, a flank face and a cutting edge in between comprising a base body of cemented carbide, cermet, ceramics, steel or high-speed steel, and a from 2 to 20 µm thick coating comprising a from 1 to 18 µm thick layer of $Ti_{1-x}Al_xC_yN_z$ with 0.40≤x≤0.95, 0≤y≤0.10 and 0.85≤z≤1.15, the layer of $Ti_{1-x}Al_xC_yN_z$ comprises crystallites with grain boundaries and being of a columnar structure, the $Ti_{1-x}Al_xC_yN_z$ comprises 85 vol-% face-centered cubic (fcc) crystal structure, wherein the process comprises the following steps in the following order:

providing the layer of $Ti_{1-x}Al_xC_yN_z$ by a CVD process,
providing a layer of $MeC_aN_b$, 0≤a≤1, 0≤b≤1, a+b=1, by a CVD process directly above the layer of $Ti_{1-x}Al_xC_yN_z$, Me is Ti and/or Zr,
blasting the surface of the coating until there is a portion of $MeC_aN_b$ remaining in an area on the rake face at a distance of from 200 to 400 µm from the cutting edge covering from 5 to 28% of the layer of $Ti_{1-x}Al_xC_yN_z$, the portion of $MeC_aN_b$ is distributed over said area.

The deposition of the layer of $Ti_{1-x}Al_xC_yN_z$ is suitably made at a process temperature within the range of from 625 to 800° C.

In one embodiment, the process comprises, before the step of blasting, subjecting the deposited layer of $Ti_{1-x}Al_xC_yN_z$ to an annealing at a temperature within the range of from 700-950° C. for a duration of from 0.5 to 12 hours under exclusion of air or oxygen, respectively, wherein the conditions are selected in a way that at grain boundaries of the $Ti_{1-x}Al_xC_yN_z$ crystallites precipitations of $Ti_{1-o}Al_oC_pN_q$ are generated, the precipitations of $Ti_{1-o}Al_oC_pN_q$ have a higher Al content than inside the $Ti_{1-x}Al_xC_yN_z$ crystallites, wherein 0.95≤o≤1.00, 0≤p≤0.10, 0.85≤q≤1.15 and (o-x)≥0.05. Suitably the precipitations of $Ti_{1-o}Al_oC_pN_q$ are generated at grain boundaries of the $Ti_{1-x}Al_xC_yN_z$ crystallites in at least the 0.3 µm uppermost part of the layer of $Ti_{1-x}Al_xC_yN_z$, preferably at least in the 0.8 µm uppermost part of the layer of $Ti_{1-x}Al_xC_yN_z$, most preferably throughout the whole layer of $Ti_{1-x}Al_xC_yN_z$.

In one embodiment, for depositing the layer of $Ti_{1-x}Al_xC_yN_z$, the CVD process comprises using as precursors $TiCl_4$, $AlCl_3$, $H_2$, and $NH_3$ which are reacted in a reaction zone. In a preferred embodiment, there is a first precursor gas mixture comprising $TiCl_4$, $AlCl_3$ and $H_2$, and a second precursor gas mixture comprising $H_2$ and $NH_3$. The first and second precursor gas mixtures are blended at the entry into the reaction zone.

Preferably, the CVD process for the deposition of the $Ti_{1-x}Al_xC_yN_z$ layer is a LP-CVD process (low pressure CVD process), which is carried out at a process pressure within the CVD reactor of from 0.05 to 8 kPa, preferably of from 0.1 to 7 kPa, particularly preferably of from 0.3 to 2 kPa. At higher process pressures, generally, no $Ti_{1-x}Al_xC_yN_z$ layers having face-centered cubic and columnar structure are achieved, but rather layers with significant proportions of w-AlN. Lower process pressures require a significantly higher technical effort for the generation of vacuum, and in addition, coating processes at lower pressures have a lower throwing power for an even distribution of the coating thicknesses across complex shaped parts.

In one embodiment, for depositing the layer of $MeC_aN_b$, the CVD process comprises using as precursors $MeCl_4$, $H_2$, and one or both of a nitrogen source and a carbon source. The nitrogen source is preferably $N_2$, or $N_2$ together with $NH_3$. The carbon source is preferably $CH_3CN$. Me is Ti and/or Zr.

The annealing of the deposited $Ti_{1-x}Al_xC_yN_z$ layer is suitably made at a temperature of from 750 to 900° C., preferably 800 to 850° C.

The duration of the annealing is suitably from 1 to 6 hours.

The annealing is preferably carried out immediately following the deposition of the layer of $Ti_{1-x}Al_xC_yN_z$ in the same reactor. This is to avoid cooling cracks which may otherwise occur if the deposited layer of $Ti_{1-x}Al_xC_yN_z$ would be cooled down before deposition of $MeC_aN_b$.

In one embodiment the annealing of the deposited layer of $Ti_{1-x}Al_xC_yN_z$ takes place both before, during, and after the deposition of the layer of $MeC_aN_b$.

In a preferred embodiment of the process the conditions of temperature and duration during annealing are selected in a way that the remaining content of face-centered cubic (fcc) crystal structure in the $Ti_{1-x}Al_xC_yN_z$ layer, after the generation of the precipitations of $Ti_{1-o}Al_oC_pN_q$ in the $Ti_{1-x}Al_xC_yN_z$ layer after the annealing, is 85 vol %, preferably 90 vol. %, more preferably ≥95 vol %, particularly preferably ≥98 vol %.

An essential process condition is also the exclusion of air or oxygen during the annealing, because otherwise the layer of $Ti_{1-x}Al_xC_yN_z$ may oxidize. The process can, for example, be carried out under vacuum or protective gas atmosphere, such as argon, hydrogen or nitrogen.

Preferably, the surface of the coating is blasted until there is a portion of $MeC_aN_b$ remaining in an area on the rake face at a distance of from 200 to 400 μm from the cutting edge covering from 6 to 26%, preferably from 7 to 24%, most preferably from 8 to 22%, of the layer of $Ti_{1-x}Al_xC_yN_z$, the portion of $MeC_aN_b$ is distributed over said area.

In the $MeC_aN_b$, Me is Ti and/or Zr. If $MeC_aN_b$ contains both Ti and Zr they may be present in any atomic ratio. Suitably, Me is Ti or Zr. In the $MeC_aN_b$, suitably $0 \leq a \leq 0.5$, $0.5 \leq b \leq 1$, preferably $0 \leq a \leq 0.1$, $0.9 \leq b \leq 1$. In a preferred embodiment $MeC_aN_b$ is TiN.

In one embodiment the precipitations of $Ti_{1-o}Al_oC_pN_q$ at grain boundaries of the $Ti_{1-x}Al_xC_yN_z$ crystallites comprise AlN with hexagonal wurtzite crystal structure (w-AlN).

In one embodiment there is a further layer provided, by a CVD process, directly onto the base body having a thickness of from 0.05 μm to 2 μm, preferably of from 0.1 μm to 1 μm, the further layer is a metal nitride or a metal carbonitride layer, Me is an element belonging to group 4 of the periodic table of elements, preferably a TiN layer or a Ti(C,N) layer. For depositing this further layer, the CVD process comprises using as precursors $MeCl_4$, $H_2$, and one or both of a nitrogen source and a carbon source. The nitrogen source is preferably $N_2$. The carbon source is preferably $CH_4$ or $CH_3CN$. Me is preferably Ti and/or Zr, most preferably Ti.

Preferably the blasting of the surface of the coating is made by wet blasting.

By "wet blasting" is herein meant a blasting process using a media comprising abrasive particles, for example aluminium oxide particles, in a liquid forming a slurry, wherein material typically is removed to some extent leading to a smoother surface of the coating. Also some residual compressive stresses are introduced into the coating.

The wet blasting uses a blasting gun from which the slurry exits a nozzle. In one embodiment, the wet blasting is performed using a blasting pressure at the exit of the nozzle of from 1.8 to 3.5 bar, preferably from 2.0 to 3 bar.

In one embodiment, the concentration of aluminium oxide particles in the slurry is from 10 to 25 vol-%, preferably from 15 to 20 vol-%.

For abrasive grains used in for example blasting there is a well-established standard—FEPA (Federation of European Producers of Abrasives)—defining the particle size. The aluminium oxide particles used in the wet blasting suitably belong to one or more of the FEPA designations F120 to F240, i.e., a mean grit size of from about 44 to about 109 μm, preferably F150 to F230, i.e., a mean grit size of from about 36 to about 82 μm. A suitable grit size is chosen to obtain the desired result in terms of $MeC_aN_b$ coverage.

In one embodiment the wet blasting is performed in a blasting direction having an angle to the surface of the coated cutting tool being from 40 to 90°, preferably from 50 to 90°, most preferably from 80 to 90°.

In one embodiment, the distance between the blasting gun nozzle and the surface of the coated cutting tool is from 75 to 200 mm, preferably from 100 to 150 mm.

The desired blasting time is dependent on all other blasting parameters, i.e., blasting pressure, concentration of aluminium oxide particles, distance between the blasting gun nozzle and the surface of the coated cutting tool, and the blasting angle.

The blasting time is suitably from 1 to 80 minutes, preferably from 1.5 to 60 minutes. These time ranges are valid for a blasting process where inserts, generally about 200-400 inserts, have been put together on a supporting net before blasting. Thus, the blasting time for an individual insert is from about 0.5 to 30 seconds, preferably from about 1 to 20 seconds.

In one embodiment, when a high blasting angle is used, i.e., between 80 to 90° the blasting time in the wet blasting is suitably from 10 to 80 minutes, preferably from 20 to 60 minutes. These time ranges are valid for a blasting process where inserts, generally about 200-400 inserts, have been put together on a supporting net before blasting. Thus, the blasting time for an individual insert is from about 2 to 10 seconds.

In one embodiment, when a lower blasting angle is used, i.e., between 45 to 70° the blasting time in the wet blasting is suitably from 1 to 10 minutes, preferably from 2 to 5 minutes. These time ranges are valid for a blasting process where inserts, generally about 200-400 inserts, have been put together on a supporting net before blasting. Thus, the blasting time for an individual insert is from about 0.2 to 2 seconds.

The goal of the blasting is to both smoothen the surface of the coating and also to remove $MeC_aN_b$ until there is a portion of $MeC_aN_b$ remaining covering only a minor part of the layer of $Ti_{1-x}Al_xC_yN_z$. If too much of the $MeC_aN_b$ remains after blasting then the tool life does not reach its optimum level. On the other hand, if too little of the $MeC_aN_b$ remains after blasting then the tool life is negatively impacted.

Finally, the present invention also relates to a use of a coated cutting tool as herein described in machining of stainless steel.

Methods

Scanning Electron Microscopy (SEM):

For scanning electron microscopy images a Supra 40 electron microscope with a field emission cathode from Carl Zeiss was used. The imaging conditions to find and characterize the grain boundary precipitations are described above. The covering of the layer of $Ti_{1-x}Al_xC_yN_z$ by the portion of $MeC_aN_b$ is suitably determined by image analysis of an at least 25 μm×15 μm area of a top view Scanning Electron Microscope (SEM) image with a magnification of 5000×.

In the examples herein, an about 25 μm×18 μm area of a top view Scanning Electron Microscope (SEM) image with a magnification of 5000× was used The software used for image analysis was "ImageJ". In the image analysis, a sufficient contrast is provided between the areas of $MeC_aN_b$ and areas of $Ti_{1-x}Al_xC_yN_z$, such as black and white. The amount of the respective area can then be determined.

The distribution of the portion of $MeC_aN_b$ over the area on the rake face at a distance of from 200 to 400 μm from the cutting edge is made by putting a grid of 3 μm×3 μm squares over a top view Scanning Electron Microscope (SEM) image with a magnification of 5000×, electronically or as a printed image. The number of squares containing both an area of $MeC_aN_b$ and an area of $Ti_{1-x}Al_xC_yN_z$ is determined. At least 70 squares are investigated. Very small areas of $MeC_aN_b$, i.e., $MeC_aN_b$ having a maximum width in the image of less than 0.1 μm, are considered insignificant and are therefore disregarded. The percentage of squares containing both an area of $MeC_aN_b$ and an area of $Ti_{1-x}Al_xC_yN_z$ out of all squares is determined.

Residual Stress Measurements:

For the analysis of residual stresses the {222} interference of the face-centered cubic $Ti_{1-x}Al_xC_yN_z$ layer can be measured according to the $\sin^2 \psi$ method applying 25 ψ angles from −60° to +60° (increment 5°) using a suitable diffractometer for this purpose. After background subtraction, Lorentz-polarization correction and $K\alpha_2$ subtraction (Rachinger separation), the positions of the lines of the interferences are determined by fitting of the profile functions to the measured data. The applied elastic constants are $\frac{1}{2}s_2$=1.93 $TPa^{-1}$ and $s_1$=−0.18 $TPa^{-1}$.

Characterization of lamellar structures in $Ti_{1-x}Al_xC_yN_z$ layers:

The confirmation and characterization of the presence of lamellar structures in the $Ti_{1-x}Al_xC_yN_z$ layers can be made by X-ray diffraction (XRD) and by conventional as well as high resolution transmission electron microscopy (TEM and HR-TEM) carried out, e.g., as described by J. Keckes et al., "Self-organized periodic soft-hard nano-lamellae in polycrystalline TiAlN thin films", Thin Solid Films 545 (2013), pages 29-32.

Surface Roughness:

The surface roughness is the arithmetical mean deviation, Ra, according to ISO 4287:1997.

DETAILED DESCRIPTION OF THE DRAWINGS

Figure 1:
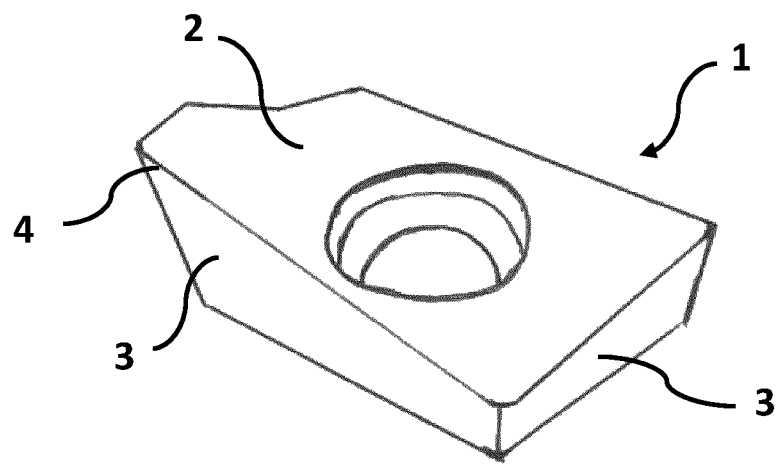
FIG. 1 shows one embodiment of a coated cutting tool which is a milling insert.

FIG. 1 shows a schematic view of one embodiment of a cutting tool (1) having a rake face (2) and flank faces (3) and a cutting edge (4). The cutting tool (1) is in this embodiment a milling insert.

Figure 2:
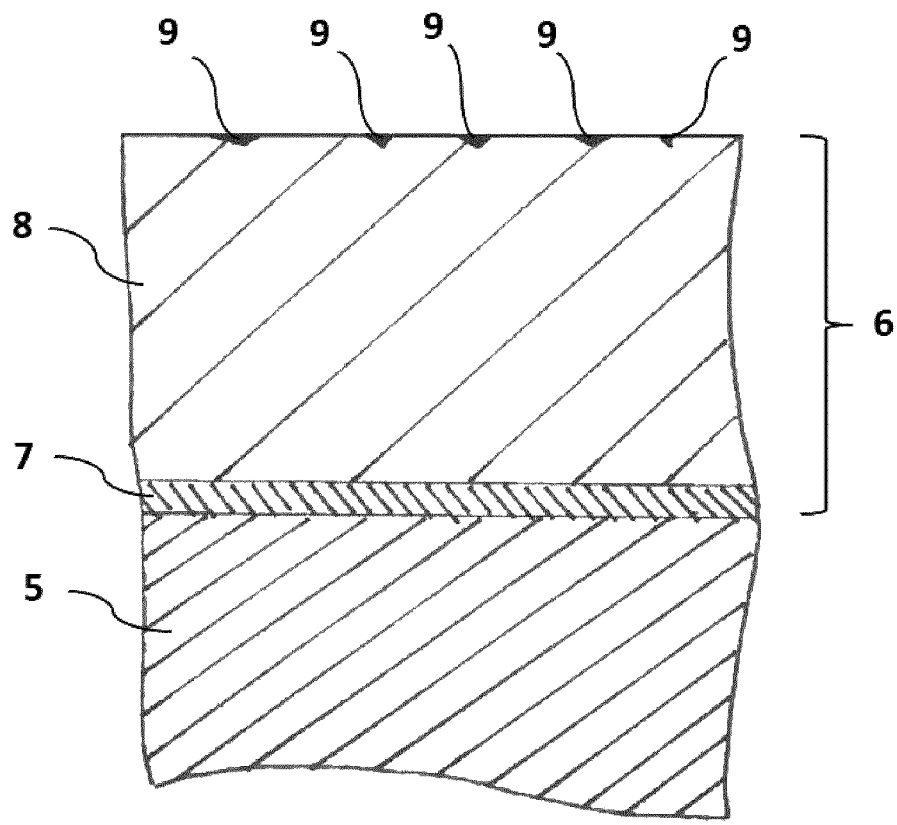
FIG. 2 shows a schematic representation of a cross-section of one embodiment of a coated cutting tool of the present invention.

FIG. 2 shows schematically a cross section of a coated cutting tool (1) of an embodiment of the invention having a base body (5) and a coating (6). The coating (6) consists of a layer of TiN (7) closest to the base body (5) followed by a layer of TiAlN (8). Portions of TiN (9) remain on the layer of TiAlN (8) after post treatment.

Figure 3:
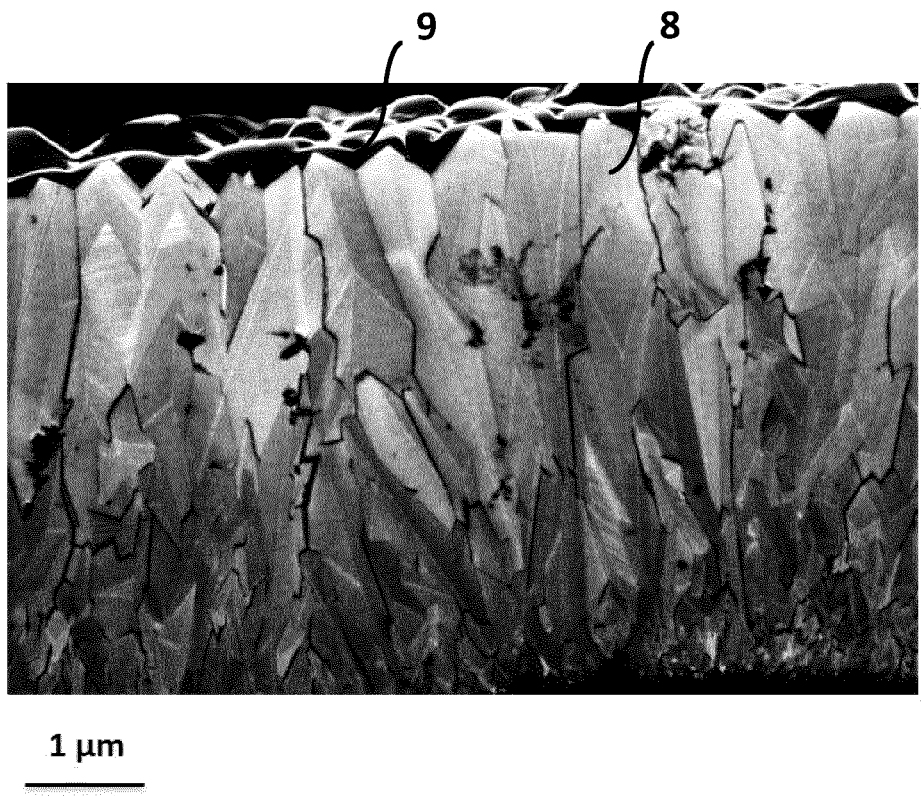
FIG. 3 shows a SEM image which is a cross-section of a coating of TiAlN with an upper layer of TiN.

FIG. 3 shows a SEM image which is a cross-section of a coating of TiAlN (8) with an upper layer of TiN (9) deposited. No post treatment of the coating has been made.

Figure 4:
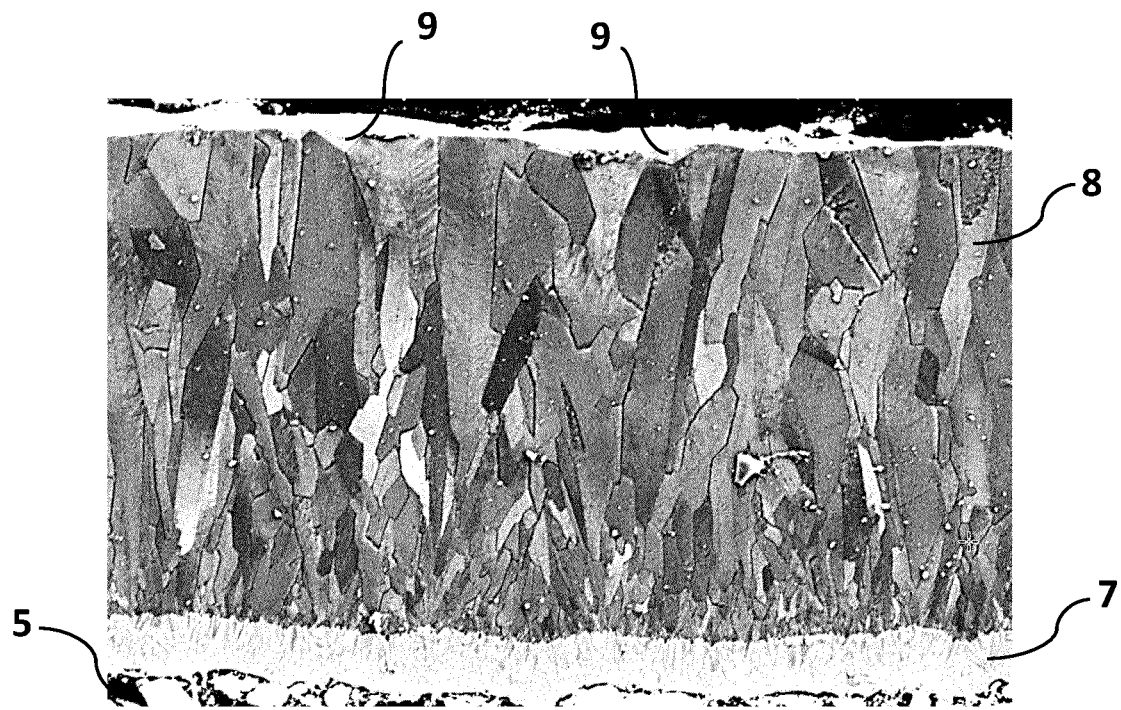
FIG. 4 shows a SEM image which is a cross-section of a coating of one embodiment of the invention.

FIG. 4 shows a SEM image which is a cross-section of a coating of one embodiment of the invention. A layer of TiN (7) is present on a cemented carbide base body (5) followed by a layer of TiAlN (8). The surface of the coating has been post treated so there has been a substantial smoothening and in particular the top facets of the TiAlN crystallites have been worn down. Portions of TiN (9) are present to a certain extent, in particular over grain boundaries of TiAlN crystallites.

Figure 5:
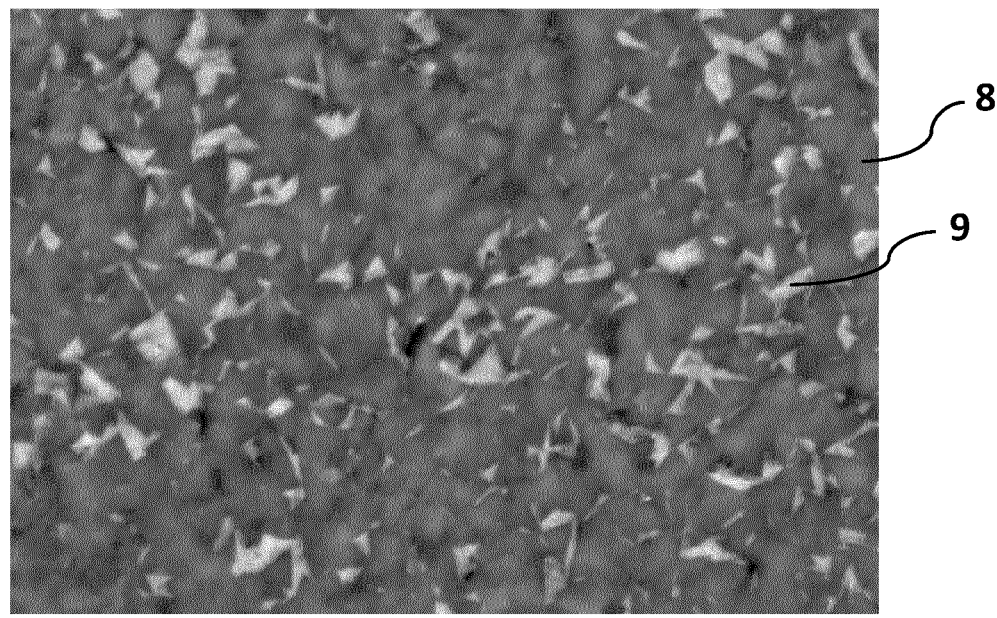
FIG. 5 shows a top view SEM image of a coated cutting tool of one embodiment of the present invention showing portions of TiN on the surface.

FIG. 5 shows a SEM image in 5000× magnification of an embodiment of the invention showing an area of about 18 μm×25 μm. Portions of TiN (9) is seen on the layer of TiAlN (8). The portions of TiN (9) are brighter on the image than the exposed TiAlN (8).

Figure 6:
FIG. 6 shows a top view SEM image, which has been subjected to image processing, of a coated cutting tool of one embodiment of the present invention showing portions of TiN on the surface.
Figure 6:
Figure 6:

FIG. 6 shows a SEM image in 5000× magnification of an embodiment of the invention showing an area of about 18 μm×25 μm. The SEM image has been subjected to image processing in order to be able to separate areas of TiN from areas of TiAlN in image analysis. Portions of TiN (8) is seen in white on the layer of TiAlN (8) in black. The coverage of TiN on the TiAlN is about 9%.

Figure 7:
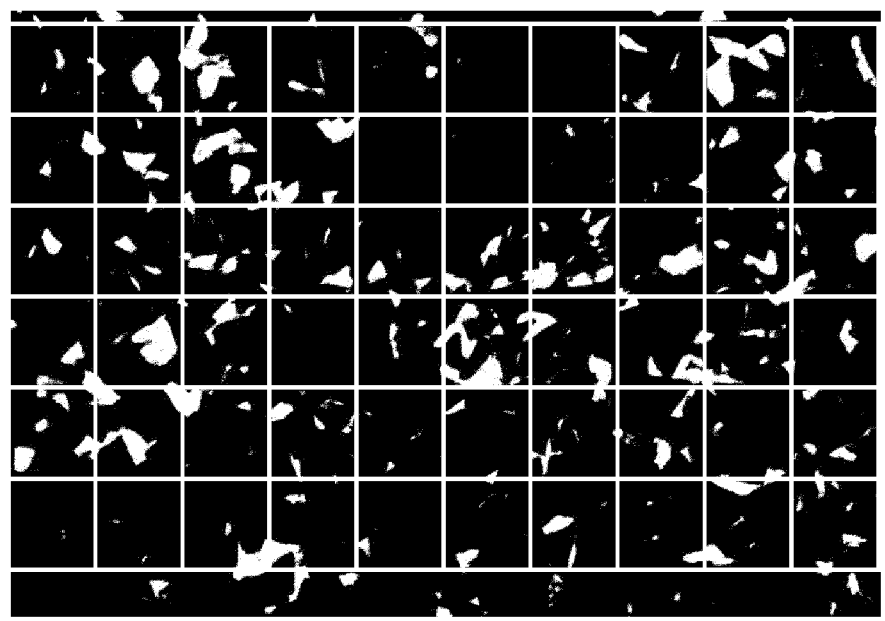
FIG. 7 shows the same image-processed SEM image as in FIG. 6 with a grid of about 2.5 μm×2.5 μm squares put over the image in order to determine the distribution of the portion of TiN on the surface.
Figure 7:
Figure 7:

FIG. 7 shows the same image-processed SEM image as in FIG. 6 with a grid of about 2.5 μm×2.5 μm squares put over the image in order to determine the distribution of the portions of TiN (9). The total number of squares is 60.

EXAMPLES

Example 1

As base bodies in these examples cemented carbide cutting inserts (milling inserts) of the geometry R390-11

M-MM having a composition of 90.5 wt-% WC, 8 wt-% Co and 1.5 wt-% (NbC+TaC) were used.

FIG. 1 shows an embodiment of the coated cutting tool (1) being a milling insert. The cutting tool (1) has a rake face (2), a flank face (3) and a cutting edge (4) in between.

For the coating of the cemented carbide indexable cutting inserts a CVD coating reactor of the type Bernex BPX325S with a reactor height of 1250 mm, a reactor diameter of 325 mm and a volume of the charge arrangement of 40 liters was used. The gas flow was radially with respect to the longitudinal axis of the reactor.

For the adhesion of the $Ti_{1-x}Al_xC_yN_z$ layer, immediately on the cemented carbide base body there was first deposited an about 0.3 μm thick TiN layer by CVD under the deposition conditions indicated in table 1:

TABLE 1

| Temp. | Pressure | Time | Reaction gas mixture [vol-%] | | |
|---|---|---|---|---|---|
| [° C.] | [kPA] | [min] | $TiCl_4$ | $N_2$ | $H_2$ |
| 850 | 15 | 120 | 1.0 | 44.0 | 55.0 |

For the preparation of the $Ti_{1-x}Al_xC_yN_z$ layer a first precursor gas mixture (VG1) containing the starting compounds $TiCl_4$ and $AlCl_3$ and a second precursor gas mixture (VG2) containing the starting component $NH_3$ as reactive nitrogen component were introduced into the reactor separately so that a blending of the two gas streams took place not earlier than at the entry into the reaction zone. The volume gas streams of the precursor gas mixtures (VG1) and (VG2) were set in a manner that a mean retention time of the reaction gases in the reactor and a total volume stream under normal conditions was achieved. The parameters for the preparation of the $Ti_{1-x}Al_xC_yN_z$ layer are indicated in table 2. The thickness of the $Ti_{1-x}Al_xC_yN_z$ layer was about 8 μm.

TABLE 2

| Temp. | Pressure | Time | Total volume stream | Retention time | Precursor gas mixture (VG1) [vol-%] | | | Precursor gas mixture (VG2) [vol-%] | |
|---|---|---|---|---|---|---|---|---|---|
| [° C.] | [kPA] | [min] | [$l_N$/min] | [sec] | $TiCl_4$ | $AlCl_3$ | $H_2$ | $H_2$ | $NH_3$ |
| 725 | 0.80 | 75 | 145.8 | 0.13 | 0.02 | 0.17 | 52.2 | 47.2 | 0.41 |

After this, the prepared cutting inserts were subjected to a period of heat treatment under the conditions indicated in table 3.

TABLE 3

| Time [h] | Temperature [° C.] | Atmosphere |
|---|---|---|
| 3 h 15 min | 850° C. | vacuum |

During the heat treatment period a 0.3 μm top layer of TiN was deposited. The process parameters for the preparation of this TiN layer is indicated in table 4. Thus, out of the 3 h 15 min heat treatment there was a period of 45 minutes TiN deposition.

TABLE 4

| Temp. | Pressure | Time | Reaction gas mixture [vol-%] | | | |
|---|---|---|---|---|---|---|
| [° C.] | [kPA] | [min] | $TiCl_4$ | $N_2$ | $H_2$ | $NH_3$ |
| 850 | 0.7 | 45 | 0.11 | 44.15 | 55.19 | 0.55 |

For the characterization of the $Ti_{1-x}Al_xC_yN_z$ layer there were applied X-ray diffraction (XRD), electron diffraction, especially EBSD, scanning electron microscopy (SEM), scanning transmission electron microscopy (STEM) and transmission electron microscopy (TEM).

In the deposited $Ti_{1-x}Al_xC_yN_z$, x=0.80, y=0 and z=1.

The average grain size of the $Ti_{1-x}Al_xC_yN_z$ was determined to be 0.4 μm. The grain size was determined by drawing a line in the middle of the layer, measuring the width of each $Ti_{1-x}Al_xC_yN_z$ columnar crystallite, and calculate an average value. A cross-sectional SEM image in magnification 5000× was taken and an average value of the individual width of about 20 crystallites was calculated.

Sample 1 was not post treated at all while samples 2-8 were post treated by different blasting procedures of different severity.

The wet blastings were performed with aluminium oxide grits (sand) the size in "mesh" stated in the table. The distance between the blasting gun nozzle and the coating surface was 120 mm for top blasting, otherwise 135 mm. When using shot peening in sample 2, $ZrO_2$-based beads were used in dry form, the beads being of a size between 70-120 μm. The blasting angle is the angle between the coating surface plane and the blasting direction. The blasting pressure is the pressure when the slurry exits the blasting gun nozzle.

The different treatments were:
1. No treatment
2. Shot peening (90°, 5.3 bar)+fine wet blasting (11-15°, 2.6 bar, FEPA 240 mesh grit size, 3 minutes)
3. TB3 (top wet blasting 90°, 2.1 bar, FEPA 230 mesh grit size, 27 minutes)
4. ERB (angled wet blasting 55°, 2.8 bar, FEPA 280 mesh grit size, 3 minutes)
5. TB1 (top wet blasting 90°, 2.0 bar, FEPA 230 mesh grit size, 54 minutes)
6. ERB (angled wet blasting 55°, 2.8 bar, 150 mesh grit size, 1.8 minutes)
7. ERB (angled wet blasting 55°, 2.1 bar, 150 mesh grit size, 3 minutes)
8. ERB (angled wet blasting 55°, 3.2 bar, 150 mesh grit size, 4.5 minutes)

The amount of TiN remaining on the outer surface was for each samples determined by image analysis of a SEM image in 5000× magnification. An about 18 μm×25 μm area about 250 μm from the cutting edge on the rake face was analysed. The software used for image analysis was "ImageJ".

The surface roughness, Ra, of the coating after the post treatment was measured for some samples. It was measured on the rake face at a distance of about 250 μm from the cutting edge.

The results are seen in table 5.

TABLE 5

| Sample | TiN coverage (%) | Surface roughness, Ra, (nm) |
|---|---|---|
| 1 | 100 | 62 |
| 2 | 62 | — |
| 3 | 25 | 53 |
| 4 | 23 | — |
| 5 | 20 | 42 |
| 6 | 9 | — |
| 7 | 6 | — |
| 8 | 2 | — |

The portion of TiN was distributed over the area on the rake face at a distance of 250 μm from the cutting edge in a way that when a grid of 2.5 μm×2.5 μm squares was put over a top view Scanning Electron Microscope (SEM) image with a magnification of 5000×, then the following results were provided:

TABLE 6

| Sample | TiN coverage (%) | Distribution (2.5 × 2.5 μm)* |
|---|---|---|
| 1 | 100 | — |
| 2 | 62 | — |
| 3 | 25 | 100% (60/60) |
| 4 | 23 | 100% (60/60) |
| 5 | 20 | 100% (60/60) |
| 6 | 9 | 95% (57/60) |
| 7 | 6 | 95% (57/60) |
| 8 | 2 | — |

*proportion of 2.5 μm × 2.5 μm squares (out of 60 squares) showing both TiN and $Ti_{1-x}Al_xC_yN_z$ FIG. 6 shows a SEM image in 5000× magnification of sample 6 showing an area of about 18 μm×25 μm. The image has been subjected to image processing. Portions of TiN are seen in white and the TiAlN is seen in black.

FIG. 7 shows the same image-processed SEM image as in FIG. 6 with a grid of about 2.5 μm×2.5 μm squares put over the image in order to determine the distribution of the portion of TiN on the surface.

Analysis by using transmission electron microscopy (TEM) has confirmed that the $Ti_{1-x}Al_xC_yN_z$ layer comprises $Ti_{1-o}Al_oC_pN_q$ precipitations at the grain boundaries of the $Ti_{1-x}Al_xC_yN_z$ crystallites. Furthermore, there is a presence of face-centered cubic (fcc) phase, >95 vol. %, in the $Ti_{1-x}Al_xC_yN_z$ crystallite, an epitaxial relationship to the crystalline domains in the $Ti_{1-o}Al_oC_pN_q$ precipitation at an adjacent grain boundary, and a presence of w-AlN phase in the $Ti_{1-o}Al_oC_pN_q$ precipitation. The average distance between $Ti_{1-x}Al_xC_yN_z$ crystallites having $Ti_{1-o}Al_oC_pN_q$ precipitations, having w-AlN structure, at their grain boundaries is about 25 nm.

Furthermore, a lamellar structure of the $Ti_{1-x}Al_xC_yN_z$ layer is present. There are alternating lamellae of higher Ti proportions (lower Al proportions) and lower Ti proportions (higher Al proportions). The regions of higher Ti proportions are in general significantly thinner than the Al-rich regions of the lamellar structure.

Furthermore, the total structure consists of face-centered cubic (fcc) phase. The entire lamellar structure consists of face-centered cubic (fcc) phase, whereby within one crystallite the same orientation is present.

Example 2: Cutting Tests

Samples 1-8 were tested in a milling operation (wet comb crack and flaking test) under the following cutting conditions:
Work piece material: Stainless steel: SS2343-28PR
Procedure: up milling, wet coolant
Feed per tooth: $f_z$=0.2 mm
Depth of cut: $a_p$=3 mm
Cutting speed: $v_c$=150 m/min
Milling width: $a_e$=15 mm
Pass length: 200 mm
The cut-off criteria, VBmax is chipping >0.3 mm
The results are seen in table 7.

TABLE 7

| Sample | TiN coverage (%) | Tool life flaking (average) (No. passes)* | Tool life (average) (No. passes)** | Relative amount of tested edges having early flaking (%) |
|---|---|---|---|---|
| 1 | 100 | 1.0 | 10.0 | 100 |
| 2 | 62 | 3.75 | 15.5 | 50 |
| 3 | 25 | 12.0 | 18.8 | 25 |
| 4 | 23 | 18.8 | 32.0 | 25 |
| 5 | 20 | 20.9 | 28.2 | 0 |
| 6 | 9 | 20.0 | 30.5 | 0 |
| 7 | 6 | 11.5 | 28.3 | 25 |
| 8 | 2 | 1.25 | 16.5 | 100 |

*passes until first flaking, i.e., the slightest visible flaking
**passes until cut-off criteria VBmax

The invention claimed is:

1. A coated cutting tool comprising:
a rake face, a flank face and a cutting edge in between the rake face and the flank face;
a base body of cemented carbide, cermet, ceramics, steel or high-speed steel; and
a coating having a total thickness of from 2 to 20 μm, wherein said coating comprises a layer of $Ti_{1-x}Al_xC_yN_z$ with 0.40≤x≤0.95, 0≤y≤0.10 and 0.85≤z≤1.15, having a thickness of from 1 to 18 μm, wherein the layer of $Ti_{1-x}Al_xC_yN_z$ includes crystallites with grain boundaries and being of a columnar structure, the $Ti_{1-x}Al_xC_yN_z$ having a ≥85 vol-% face-centered cubic (fcc) crystal structure, and, on the rake face, a portion of $MeC_aN_b$, 0≤a≤1,0≤b≤1, a+b=1, present on the layer of $Ti_{1-x}Al_xC_yN_z$, wherein the layer of $Ti_{1-x}Al_xC_yN_z$ together with the portion of $MeC_aN_b$ forms an outermost part of the coating, Me is Ti and/or Zr, wherein a portion of $MeC_aN_b$ in an area on the rake face at a distance of from 200 to 400 μm from the cutting edge covers from 5 to 28% of the layer of $Ti_{1-x}Al_xC_yN_z$ (8), the portion of $MeC_aN_b$ being distributed over said area.

2. The coated cutting tool according to claim 1, wherein the layer of $Ti_{1-x}Al_xC_yN_z$ includes precipitations of $Ti_{1-o}Al_oC_pN_q$ at grain boundaries of the $Ti_{1-x}Al_xC_yN_z$ crystallites, the precipitations of $Ti_{1-o}Al_oC_pN_g$ have a higher Al content than inside the $Ti_{1-x}Al_xC_yN_z$ crystallites, wherein $0.95 \leq o \leq 1.00$, $0 \leq p \leq 0.10$, $0.85 \leq q \leq 1.15$ and $(o-x) \geq 0.05$.

3. The coated cutting tool according to claim 2, wherein the layer of $Ti_{1-x}Al_xC_yN_z$ includes the precipitations of $Ti_{1-o}Al_oC_pN_q$ at grain boundaries of the $Ti_{1-x}Al_xC_yN_z$ crystallites in a 0.3 µm uppermost part of the layer.

4. The coated cutting tool according to claim 2, wherein the layer of $Ti_{1-x}Al_xC_yN_z$ includes the precipitations of $Ti_{1-o}Al_oC_pN_g$ at grain boundaries of the $Ti_{1-x}Al_xC_yN_z$ crystallites throughout an entirety of the layer.

5. The coated cutting tool according to claim 2, wherein the precipitations of $Ti_{1-o}Al_oC_pN_q$ at grain boundaries of the $Ti_{1-x}Al_xC_yN_z$ crystallites have AlN with a hexagonal wurtzite crystal structure (w-AlN).

6. The coated cutting tool according to claim 1, wherein the $Ti_{1-x}Al_xC_yN_z$ has a ≥90 vol-% face-centered cubic (fcc) crystal structure.

7. The coated cutting tool according to claim 1, wherein the $Ti_{1-x}Al_xC_yN_z$ has stoichiometric coefficients of $0.60 \leq x \leq 0.90$, $y=0$ and $0.85 \leq z \leq 1.15$.

8. The coated cutting tool according to claim 1, wherein the portion of $MeC_aN_b$ in an area on the rake face at a distance of from 200 to 400 µm from the cutting edge covers from 7 to 24% of the layer of $Ti_{1-x}Al_xC_yN_z$, the portion of $MeC_aN_b$ being distributed over said area.

9. The coated cutting tool according to claim 1, wherein the $MeC_aN_b$ is TiN or Ti(C,N).

10. The coated cutting tool according to claim 1, wherein a surface roughness, Ra, of the coating on the rake face is from 20 to 60 nm, at a distance of from 200 to 400 µm from the cutting edge.

11. A process for the production of a coated cutting tool having a rake face, a flank face and a cutting edge in between the rake face and the flank face, the cutting tool including a base body of cemented carbide, cermet, ceramics, steel or high-speed steel, and a from 2 to 20 µm thick coating including a from 1 to 18 µm thick layer of $Ti_{1-x}Al_xC_yN_z$ with $0.40 \leq x \leq 0.95$, $0 \leq y \leq 0.10$ and $0.85 \leq z \leq 1.15$, the layer of $Ti_{1-x}Al_xC_yN_z$ having crystallites with grain boundaries and being of a columnar structure, the $Ti_{1-x}Al_xC_yN_z$ having a ≥85 vol-% face-centered cubic (fcc) crystal structure, wherein the process comprises the following steps:

providing the layer of $Ti_{1-x}Al_xC_yN_z$ by a CVD process;

providing a layer of $MeC_aN_b$, $0 \leq a \leq 1$, $0 \leq b \leq 1$, $a+b=1$, by a CVD process directly above the layer of $Ti_{1-x}Al_xC_yN_z$, wherein Me is Ti and/or Zr;

blasting a surface of the coating until there is a portion of $MeC_aN_b$ remaining in an area on the rake face at a distance of from 200 to 400 µm from the cutting edge covering from 5 to 28% of the layer of $Ti_{1-x}Al_xC_yN_z$, the portion of $MeC_aN_b$ being distributed over said area.

12. The process according to claim 11, wherein, before the step of blasting the surface of the coating, the deposited layer of $Ti_{1-x}Al_xC_yN_z$ is subjected to an annealing at a temperature within the range of from 700 to 950° C. for a duration of from 0.5 to 12 hours under exclusion of air or oxygen, wherein the conditions are selected in a way that at grain boundaries of the $Ti_{1-x}Al_xC_yN_z$ crystallites precipitations of $Ti_{1-o}Al_oC_pN_q$ are generated, the precipitations of $Ti_{1-o}Al_oC_pN_q$ having a higher Al content than inside the $Ti_{1-x}Al_xC_yN_z$ crystallites, wherein $0.95 \leq o \leq 1.00$, $0 \leq p \leq 0.10$, $0.85 \leq q \leq 1.15$ and $(o-x) \geq 0.05$.

13. The process according to claim 12, wherein the annealing of the deposited layer of $Ti_{1-x}Al_xC_yN_z$ takes place both before, during, and after the deposition of the layer of $MeC_aN_b$.

14. The process according to claim 11, wherein the CVD process for the deposition of the layer of $Ti_{1-x}Al_xC_yN_z$ is a LP-CVD process and wherein the CVD process is carried out at a process pressure in the CVD reactor of from 0.05 to 8 kPa.

15. The process according to claim 11, wherein the blasting of the surface of the coating is made by wet blasting using a slurry of aluminium oxide particles which the slurry exits a blasting gun nozzle, the wet blasting is performed using a blasting pressure at the exit of the nozzle of from 1.8 to 3.5 bar, a concentration of aluminium oxide particles in the slurry being from 10 to 25 vol-%, wherein the aluminium oxide particles belong to one or more of the FEPA designations F120 to F240, wherein the distance between the blasting gun nozzle and the surface of the coated cutting tool is from 75 to 200 mm, and wherein the wet blasting is performed in a blasting direction having an angle to the surface of the coated cutting tool from 40 to 90°, the blasting time being from 1 to 75 minutes.

* * * * *